(12) United States Patent
Qu

(10) Patent No.: US 8,595,171 B2
(45) Date of Patent: Nov. 26, 2013

(54) SYSTEM AND METHOD FOR RULE SET VALIDATION

(75) Inventor: Jufeng Qu, West Bloomfield, MI (US)

(73) Assignee: Siemens Product Lifecycle Management Software Inc., Plano, TX (US)

(*) Notice: Subject to any disclaimer, the term of this patent is extended or adjusted under 35 U.S.C. 154(b) by 1155 days.

(21) Appl. No.: 12/052,696

(22) Filed: Mar. 20, 2008

(65) Prior Publication Data
US 2008/0294587 A1    Nov. 27, 2008

Related U.S. Application Data

(60) Provisional application No. 60/896,698, filed on Mar. 23, 2007.

(51) Int. Cl.
*G06N 5/02*    (2006.01)

(52) U.S. Cl.
USPC .................. 706/47; 703/13; 703/14; 703/17

(58) Field of Classification Search
USPC ............. 706/45, 47, 55, 62; 703/13, 14, 17
See application file for complete search history.

(56) References Cited

U.S. PATENT DOCUMENTS

| | | | | |
|---|---|---|---|---|
| 5,708,798 A | * | 1/1998 | Lynch et al. ...................... | 703/1 |
| 5,825,651 A | * | 10/1998 | Gupta et al. ................... | 700/103 |
| 5,963,953 A | * | 10/1999 | Cram et al. ............................. | 1/1 |
| 6,035,305 A | * | 3/2000 | Strevey et al. ......................... | 1/1 |
| 6,405,308 B1 | * | 6/2002 | Gupta et al. ....................... | 713/1 |
| 6,675,294 B1 | * | 1/2004 | Gupta et al. ....................... | 713/1 |
| 7,043,407 B2 | * | 5/2006 | Lynch et al. ....................... | 703/1 |
| 7,103,434 B2 | * | 9/2006 | Chernyak et al. ................ | 700/98 |
| 7,200,582 B1 | * | 4/2007 | Smith ............................. | 706/47 |
| 7,584,079 B2 | * | 9/2009 | Lichtenberg et al. .............. | 703/2 |
| 2002/0007348 A1 | * | 1/2002 | Ali et al. .......................... | 705/51 |
| 2005/0114193 A1 | | 5/2005 | Kroening | |
| 2005/0278271 A1 | * | 12/2005 | Anthony et al. .............. | 706/919 |
| 2006/0064656 A1 | * | 3/2006 | Lakshmanan et al. ............ | 716/5 |
| 2007/0239570 A1 | * | 10/2007 | Kam-Chak Cheng et al. . | 705/35 |

OTHER PUBLICATIONS

International Search Report for PCT/US2008/003765 Dated Sep. 7, 2008, 3 pages.

Bhateja R et al: "Valkyrie: A Validation Subsystem of a Version Server for Computer aided design data" Proceedings of the Design Automation Conference. Miami Beach, Jun. 28, 1987, pp. 321-327.

* cited by examiner

*Primary Examiner* — Kakali Chaki
*Assistant Examiner* — Mai T Tran

(57) ABSTRACT

A system, method, and computer program for validating a rule set for applicable checks of a part, comprising querying a validation rule set; correlating a part data to said validation rule set; comparing a part against said part data; and whereby said part is approved at an event, and appropriate means and computer-readable instructions.

17 Claims, 4 Drawing Sheets

SYSTEM AND METHOD FOR RULE SET VALIDATION

CROSS-REFERENCE TO RELATED APPLICATIONS

This application claims priority to Provisional U.S. Application Ser. No. 60/896,698, filed on Mar. 23, 2007, which application is incorporated herein by reference in its entirety.

TECHNICAL FIELD

The presently preferred embodiment of the innovations described herein relate generally to software applications. More specifically, the presently preferred embodiment relates to a system and method for validating a rule set for applicable checks of a part.

BACKGROUND

It is widely accepted practice to apply design data quality checks during product development that are automatically enforced based upon product functionality and industry standard and/or government regulations. For example, in assembly design, a dataset must pass workflow processes at a sequence of status check points to be released at a major milestone event. One of the verifications that is performed during each workflow process is to verify that the target dataset has passed a number of validation checks. For example, dataset A is targeted to be released at major event 1, if it must pass each list of validation checks at status 0, 1, 2, 3 and so on. The list of validation checkers that are verified at each status check point may be the same with different rules which means that the same checker could be optional, that is must run but result status can be ignored, at the beginning and becomes mandated, that is must run and pass status is required, from certain status check point and on. Different types of datasets may be subject to different checks. Throughout the product development process, design data may be classified in various disciplines and subject to different quality checks at different points of time. Missing any one check could potentially cause quality issues later on.

What is needed is a system and method for validating a rule set for applicable checks of a part where parameters are verified for a checker even though the check result is passed knowing that the lists of validation checks are different from commodity to commodity.

SUMMARY

To achieve the foregoing, and in accordance with the purpose of the presently preferred embodiment as described herein, the present application provides a computer implemented method for validating a rule set for applicable checks of a part, comprising querying a validation rule set; correlating a part data to said validation rule set; comparing a part against said part data; and whereby said part is approved at an event. The method, further comprising reporting a result of said comparing step. The method, wherein said validation rule set has a plurality of checks. The method, wherein said checks are one of mandatory and optional. The method, wherein said validation rule set is queried by a key value. The method, wherein said key value is supplied by one of a user input and a part attribute. The method, wherein said validation rule set is translated from a set of design requirements. The method, further comprising associating a status check with said comparing step.

An advantage of the presently preferred embodiment is to provide a computer-program product tangibly embodied in a machine readable medium to perform a method for validating a rule set for applicable checks of a part, comprising instructions operable to cause a computer to query a validation rule set; correlate a part data to said validation rule set; and compare a part against said part data; whereby said part is approved at an event. The product, further comprising instructions to report a result of said comparing step. The product, wherein said validation rule set has a plurality of checks. The product, wherein said checks are one of mandatory and optional. The product, wherein said validation rule set is queried by a key value. The product, wherein said key value is supplied by one of a user input and a part attribute. The product, wherein said validation rule set is translated from a set of design requirements. The product, further comprising instructions to associate a status check with said comparing step.

Another advantage of the presently preferred embodiment is to provide a data processing system having at least a processor and accessible memory to implement a method for validating a rule set for applicable checks of a part, comprising means for querying a validation rule set; means for correlating a part data to said validation rule set; means for comparing a part against said part data.

Other advantages of the presently preferred embodiment will be set forth in part in the description and in the drawings that follow, and, in part will be learned by practice of the presently preferred embodiment. The presently preferred embodiment will now be described with reference made to the following Figures that form a part hereof. It is understood that other embodiments may be utilized and changes may be made without departing from the scope of the presently preferred embodiment.

BRIEF DESCRIPTION OF THE DRAWINGS

A presently preferred embodiment will hereinafter be described in conjunction with the appended drawings, wherein like designations denote like elements, and.

DETAILED DESCRIPTION OF THE PREFERRED EMBODIMENTS

Computer System

Figure 4:
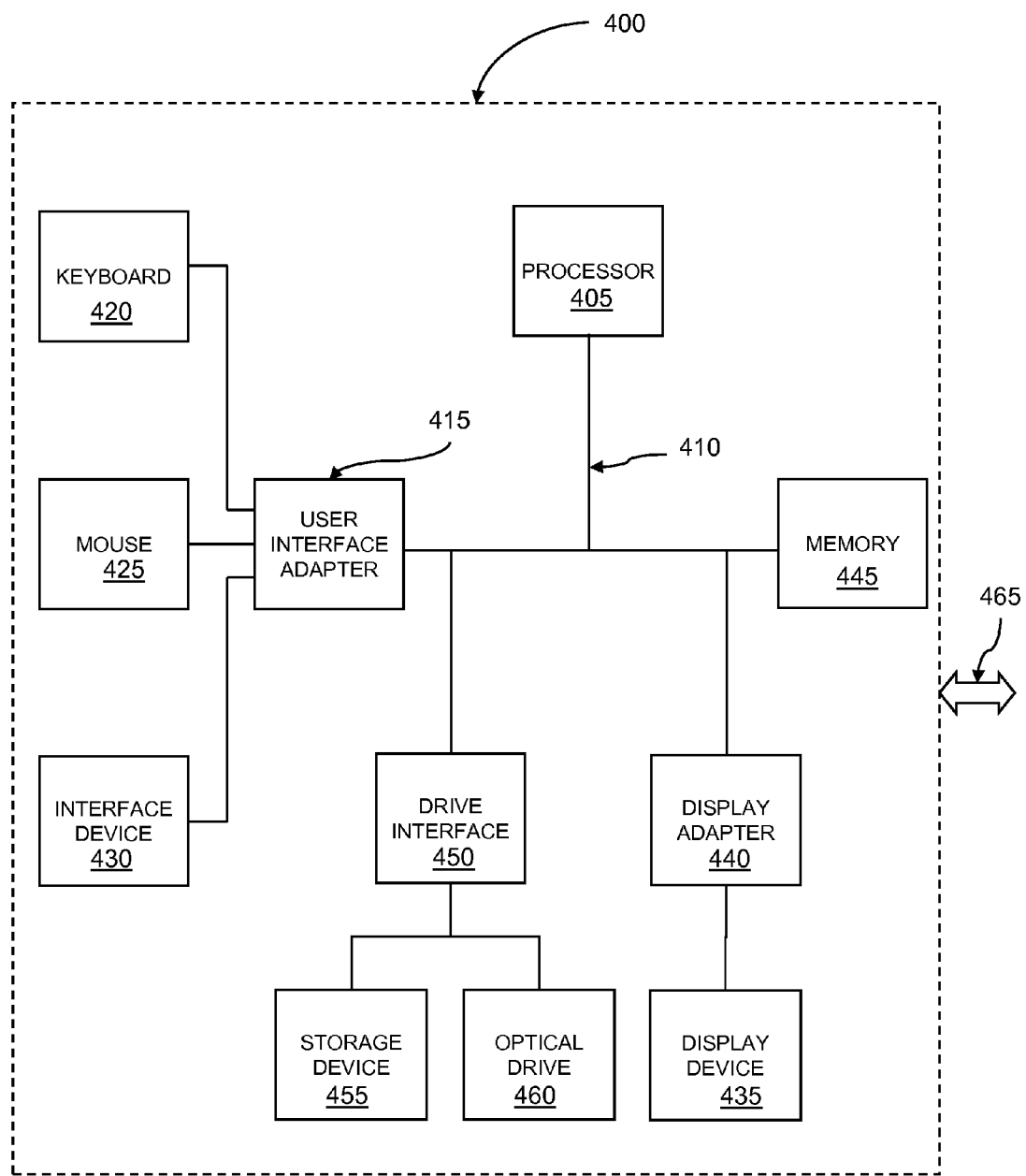
FIG. 4 is a block diagram of a computer environment in which the presently preferred embodiment may be practiced.

The numerous innovative teachings of the present application will be described with particular reference to the presently preferred embodiments. It should be understood, however, that this class of embodiments provides only a few examples of the many advantageous uses of the innovative teachings herein. The presently preferred embodiment provides, among other things, a system and method for validating a rule set for applicable checks of a part. Now therefore, in accordance with the presently preferred embodiment, an operating system executes on a computer, such as a general-purpose personal computer. FIG. 4 and the following discussion are intended to provide a brief, general description of a suitable computing environment in which the presently preferred embodiment may be implemented. Although not required, the presently preferred embodiment will be described in the general context of computer-executable instructions, such as program modules, being executed by a personal computer. Generally program modules include routines, programs, objects, components, data structures, etc., that perform particular tasks or implement particular abstract data types. The presently preferred embodiment may be performed in any of a variety of known computing environments.

Referring to FIG. 4, an exemplary system for implementing the presently preferred embodiment includes a general-purpose computing device in the form of a computer 400, such as a desktop or laptop computer, including a plurality of related peripheral devices (not depicted). The computer 400 includes a microprocessor 405 and a bus 410 employed to connect and enable communication between the microprocessor 405 and a plurality of components of the computer 400 in accordance with known techniques. The bus 410 may be any of several types of bus structures including a memory bus or memory controller, a peripheral bus, and a local bus using any of a variety of bus architectures. The computer 400 typically includes a user interface adapter 415, which connects the microprocessor 405 via the bus 410 to one or more interface devices, such as a keyboard 420, mouse 425, and/or other interface devices 430, which can be any user interface device, such as a touch sensitive screen, digitized pen entry pad, etc. The bus 410 also connects a display device 435, such as an LCD screen or monitor, to the microprocessor 405 via a display adapter 440. The bus 410 also connects the microprocessor 405 to a memory 445, which can include ROM, RAM, etc.

The computer 400 further includes a drive interface 450 that couples at least one storage device 455 and/or at least one optical drive 460 to the bus. The storage device 455 can include a hard disk drive, not shown, for reading and writing to a disk, a magnetic disk drive, not shown, for reading from or writing to a removable magnetic disk drive. Likewise the optical drive 460 can include an optical disk drive, not shown, for reading from or writing to a removable optical disk such as a CD ROM or other optical media. The aforementioned drives and associated computer-readable media provide non-volatile storage of computer readable instructions, data structures, program modules, and other data for the computer 400.

The computer 400 can communicate via a communications channel 465 with other computers or networks of computers. The computer 400 may be associated with such other computers in a local area network (LAN) or a wide area network (WAN), or it can be a client in a client/server arrangement with another computer, etc. Furthermore, the presently preferred embodiment may also be practiced in distributed computing environments where tasks are performed by remote processing devices that are linked through a communications network. In a distributed computing environment, program modules may be located in both local and remote memory storage devices. All of these configurations, as well as the appropriate communications hardware and software, are known in the art.

Software programming code that embodies the presently preferred embodiment is typically stored in the memory 445 of the computer 400. In the client/server arrangement, such software programming code may be stored with memory associated with a server. The software programming code may also be embodied on any of a variety of non-volatile data storage device, such as a hard-drive, a diskette or a CD-ROM. The code may be distributed on such media, or may be distributed to users from the memory of one computer system over a network of some type to other computer systems for use by users of such other systems. The techniques and methods for embodying software program code on physical media and/or distributing software code via networks are well known and will not be further discussed herein.

Rule Set Validation System

Figure 1:
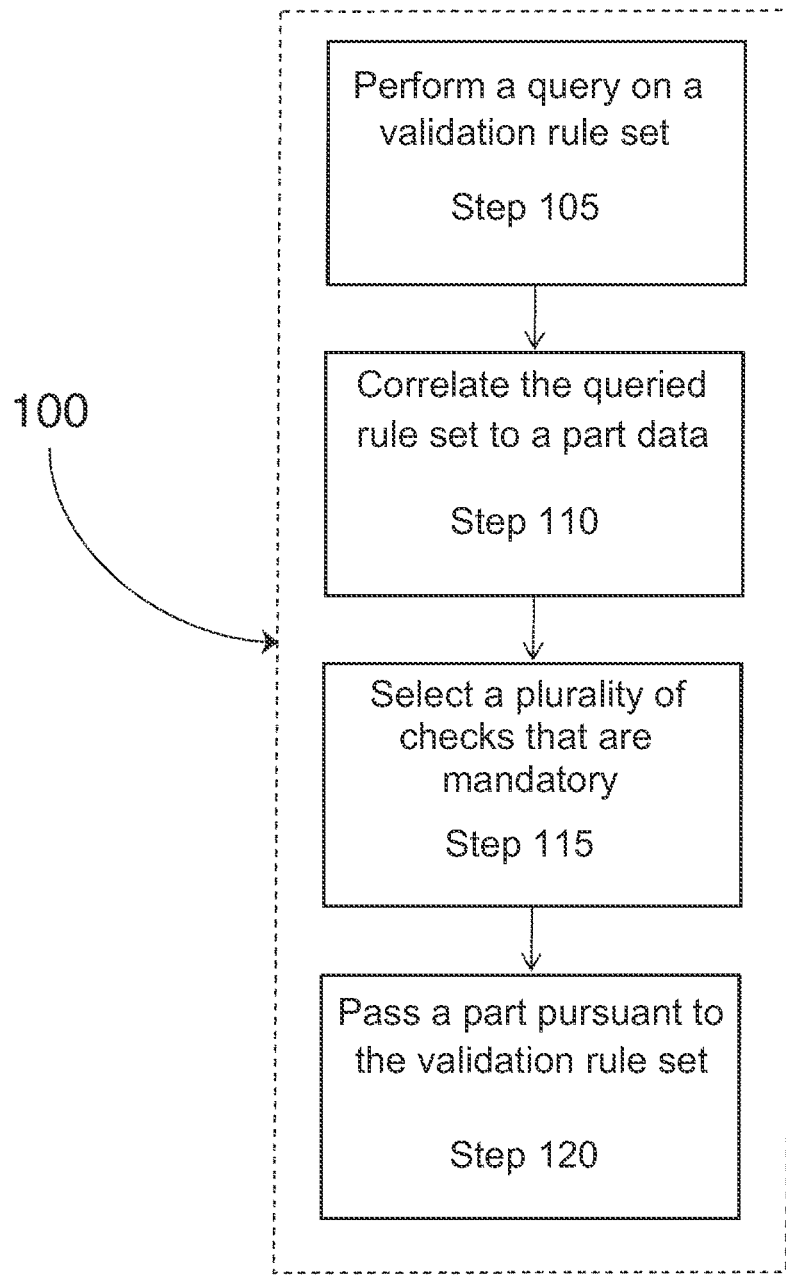
FIG. 1 is a logic flow diagram of the method employed by the presently preferred embodiment.

FIG. 1 is a logic flow diagram of the method employed by the presently preferred embodiment. Referring to FIG. 1, a computer implemented method for validating a rule set for applicable checks of a part 100 where the method performs a query on a validation rule set (Step 105). Next, correlate the queried rule set to a part data (Step 110). Then, select a plurality of checks that are mandatory (Step 115). Finally, pass a part pursuant to the validation rule set when the result of the rule checks is positive (Step 120) so that the part is approved at an event. The method for validating a rule set for applicable part checks in accordance with the presently preferred embodiment are set forth in more detail below.

Figure 2:
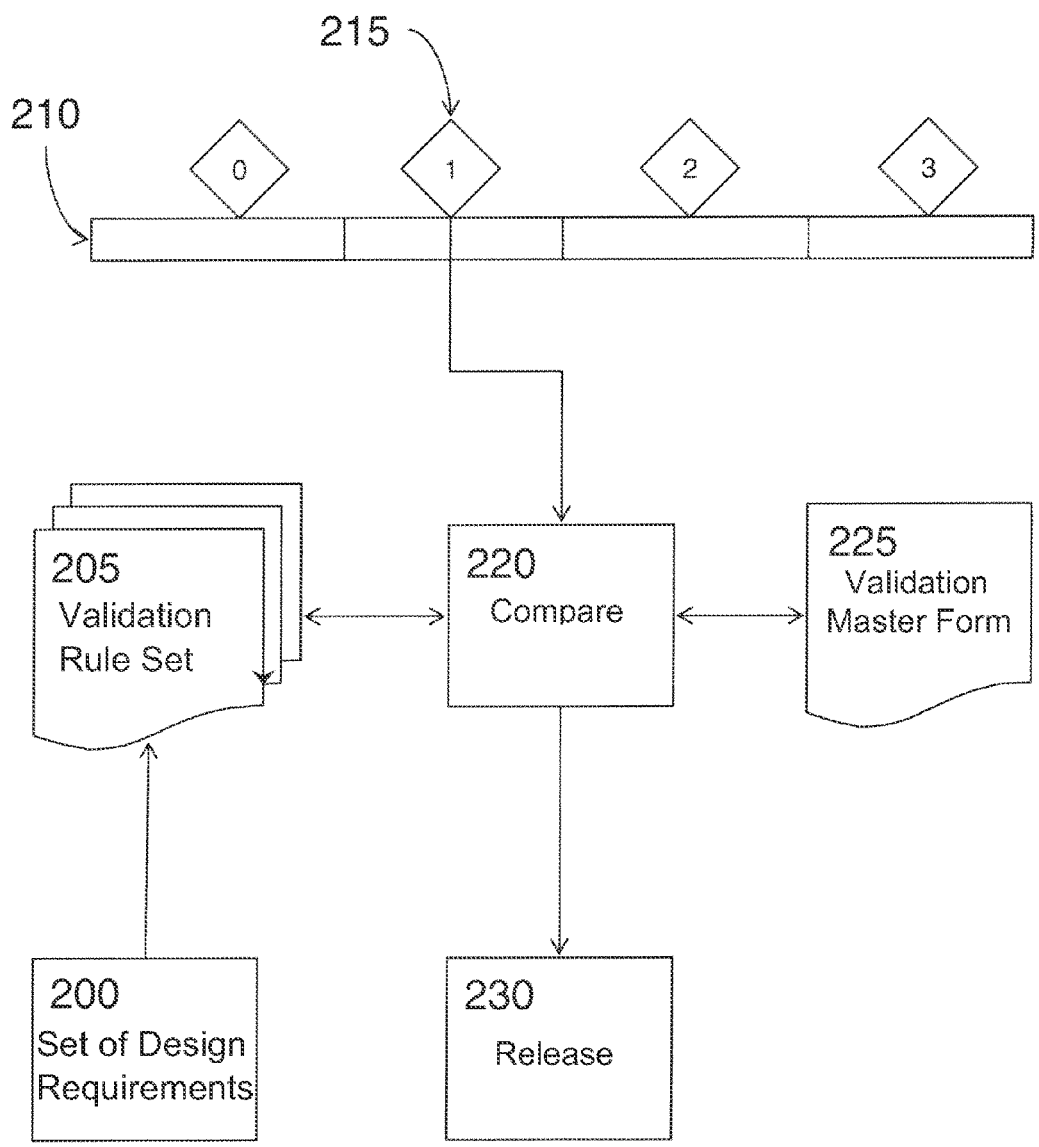
FIG. 2 illustrates a data flow of rules at an event.

FIG. 2 illustrates a data flow of rules at an event. Referring to FIG. 2, the user has a set of design requirements 200 that preferably has a template of industry standards and other customized checks that are compared against a product design during product development to ensure the product design meets certain standards. The set of design requirements 200 is inputted, or otherwise imported, into a product data management (PDM) system similar to Teamcenter® that is commercially available for sale by Siemens Product Lifecycle Management Software, Inc., using techniques and methods well understood in the art of computer applications. That inputted set of design requirements 200 is then translated into a validation rule set 205 (or list of validation checks) for a variety of datatypes, e.g., part files, sheet-metal files, master files. The validation rule set 205 contains rules having mandatory flags and optional flags. The rules with mandatory flags must be compared against the datatypes, but those rules with the optional flag are still compared to the datatypes. The optional flag results are ignored for purposes of validating against the set of design requirements 200. Flag values can be TRUE or FALSE.

Continuing with FIG. 2, in 210 of the product design, there are various status checks 215 embedded throughout to ensure sufficient progress is made in the development of the product design. These status checks 215, or events, may have the validation rule set 205 associated with them and call upon a validation check before proceeding with the development process 210. When a validation check is called, data obtained from a CAD application such as NX® sold commercially by Siemens Product Lifecycle Management Software, Inc., inputs data related to the product design into the PDM system. This product design data is compared against the validation rule set 205 to assure compliance with the set of design requirements 200. Thus at the designated milestone event 215, the validation rule set 205 is compared with the dataset available in the product design data, at 220. The results of this comparison are outputted to a validation master form 225. One validation rule set 205 may be needed at each status check 215 for a commodity. Commodity as used in this context refers to different functionalities of the types of datasets, for example, body & electrical. Once the validation master form 225 matches the rules having the mandatory flags of TRUE with those in the set of design requirements 200, the product design is determined "released" 230 for the status check 215.

Example

Figure 3:
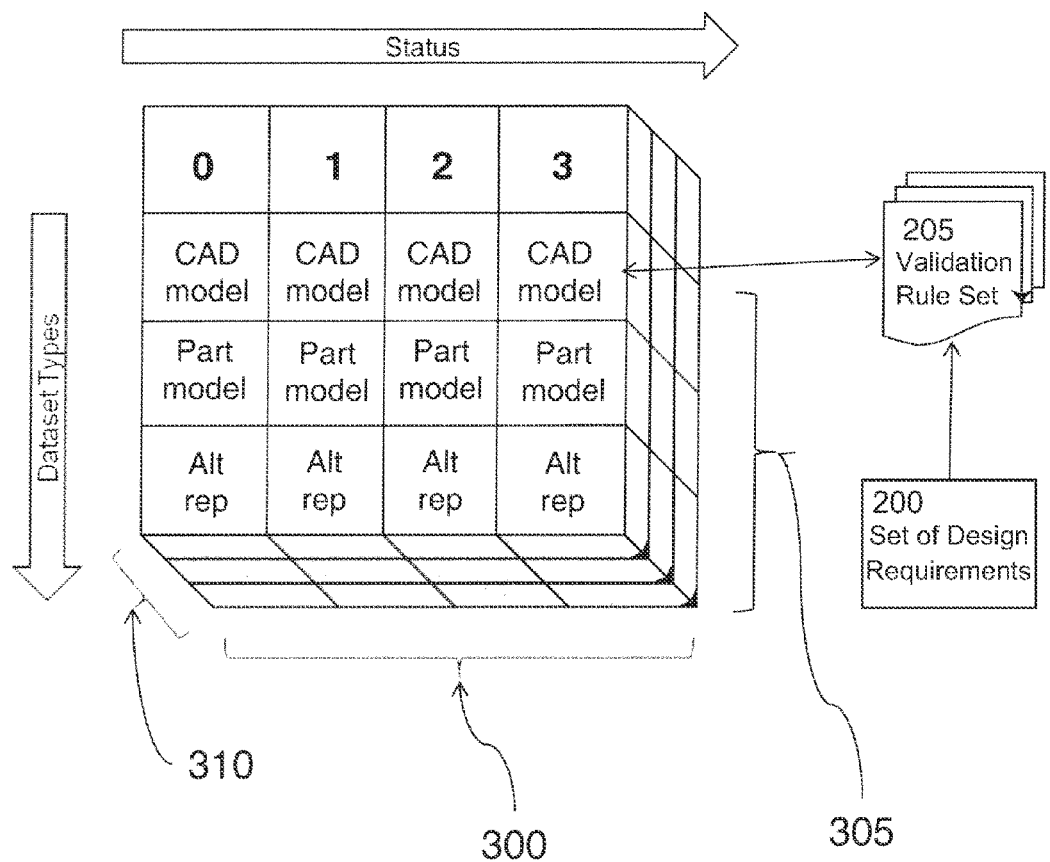
FIG. 3 illustrates an example of the presently preferred embodiment.

FIG. 3 illustrates an example of the presently preferred embodiment. Referring to FIG. 3 in an environment where the CAD application and the PDM system cooperate, a list of statuses 300 (0, 1, 2, 3) represents the milestone events, or status checks 215. Preferable, a CAD model or a part drawing is identified as various dataset types having different variables 305, where the different variables are supplied by the validation rule set 205 and the inputted set of design requirements 200. An additional dimension of the illustrated matrix classifies parts according to functionality or commodity 310, e.g., Body, Electrical and Interior. Each variable in the matrix is flagged as mandatory or optional, where the value associated is either TRUE or FALSE. Alternatively, there can be a list of numerical values that must be checked with the target design data. Describing a sample validation rule set 205 is preferably done in combination with the following tables:

TABLE 1

| Commodity - Body | | | |
|---|---|---|---|
| 0 | 1 | 2 | 3 |
| check: 0 CAD Model - T | check: 1 CAD Model - F | check: 2 CAD Model - F | check: 3 CAD Model - T |
| check: 0 | check: 1 | check: 2 | check: 3 |

TABLE 1-continued

| Commodity - Body | | | |
|---|---|---|---|
| 0 | 1 | 2 | 3 |
| Part Model - T check: 0 Alt Rep - F | Part Model - T check: 1 Alt Rep - T | Part Model - F check: 2 Alt Rep - F | Part Model - T check: 3 Alt Rep - F |

TABLE 2

| Commodity - Electrical | | | |
|---|---|---|---|
| 0 | 1 | 2 | 3 |
| check: 0 CAD Model - T | check: 1 CAD Model - F | check: 2 CAD Model - T | check: 3 CAD Model - T |
| check: 0 Part Model - T check: 0 Alt Rep - F | check: 1 Part Model - T check: 1 Alt Rep - T | check: 2 Part Model - T check: 2 Alt Rep - F | check: 3 Part Model - T check: 3 Alt Rep - F |

TABLE 3

| Commodity - Interior | | | |
|---|---|---|---|
| 0 | 1 | 2 | 3 |
| check: 0 CAD Model - T | check: 1 CAD Model - F | check: 2 CAD Model - F | check: 3 CAD Model - T |
| check: 0 Part Model - T check: 0 Alt Rep - F | check: 1 Part Model - T check: 1 Alt Rep - T | check: 2 Part Model - T check: 2 Alt Rep - F | check: 3 Part Model - T check: 3 Alt Rep - F |

TABLE 4

| Check Definitions | | | |
|---|---|---|---|
| 0 | 1 | 2 | 3 |
| check: 0 Check name: VDA file name check Check Program Utility: vda_file_check.exe List of numerical values: p1 = XXX, p2 = YYY, p3 = ZZZ. | check: 1 Check name: group pattern check Check Program Utility: grp_ptrn_chck.exe List of numerical values: p1 = XXX, p2 = YYY, p3 = ZZZ. | check: 2 Check name: CAE meshing check Check Program Utility: meshing_check.exe List of numerical values: none. | check: 3 Check name: clearance check Check Program Utility: clearnce_check.exe List of numerical values: Max = MMM, Min = NNN. | where "check: 1" refers to the instance of the validation check at a corresponding event number, 1, for example; and "CAD Model" (or "Part Model," or "Alt Rep") is the dataset type and the T or F is the return of the Flag value when the CAD model is compared to the validation rule set 205, for example. The logic of querying the validation rule set 205 preferably starts by an independent query by key value, supplied from pre-configured user inputs or part attributes, for example. A check is selected if the independent query returns positive on any dimension. The part is then rendered passing the validation rule set 205 preferably when the applicable checks have been performed so that the results are up to date and pass, and numerical values are satisfied. In a larger context, once the validation rule set 205 is defined and imported into the PDM system, the validation rule set 205 can be called up by workflow processes or baseline operations to automatically verify if the target CAD data satisfies the validation rule set 205. The workflow processes or baseline operations can issue "go" or "no-go" decisions based upon verification.

CONCLUSION

The presently preferred embodiment may be implemented in digital electronic circuitry, or in computer hardware, firmware, software, or in combinations thereof. An apparatus of the presently preferred embodiment may be implemented in a computer program product tangibly embodied in a machine-readable storage device for execution by a programmable processor; and method steps of the presently preferred embodiment may be performed by a programmable processor executing a program of instructions to perform functions of the presently preferred embodiment by operating on input data and generating output.

The presently preferred embodiment may advantageously be implemented in one or more computer programs that are executable on a programmable system including at least one programmable processor coupled to receive data and instructions from, and to transmit data and instructions to, a data storage system, at least one input device, and at least one output device. The application program may be implemented in a high-level procedural or object-oriented programming language, or in assembly or machine language if desired; and in any case, the language may be an assembled, compiled or interpreted language.

Generally, a processor will receive instructions and data from a read-only memory and/or a random access memory. Storage devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks. Any of the foregoing may be supplemented by, or incorporated in, specially-designed ASICs (application2-specific integrated circuits).

A number of embodiments have been described. It will be understood that various modifications may be made without departing from the spirit and scope of the presently preferred embodiment, such as using a text file or some other method to communicate the validation rule set, etc. Therefore, other implementations are within the scope of the following claims.

What is claimed is:

1. A computer implemented method for validating a rule set for applicable checks of a part, comprising:
    generating a design of the part using a computer aided design application;
    querying a validation rule set, the validation rule set being produced by translating an inputted set of design requirements, the validation rule set corresponding to a plurality of datatypes including at least one of part files, sheet-metal files, and master files;
    correlating a part data to said validation rule set;
    comparing the design of the part against said part data to determine whether the design of the part passes a plurality of checks in the validation rule set, the plurality of checks including one or more requirements for the design of the part at a plurality of events throughout the design of the part; and
    whereby said part is approved at an event in the plurality of events, wherein each step is performed by a data processing system, wherein the plurality of checks include mandatory checks and optional checks for the one or more requirements for the design of the part, wherein the design of the part is compared against each of the mandatory checks and optional checks for the one or more requirements for the design of the part, and wherein results from the optional checks are not included in approving the design of the part at the event.

2. The method of claim 1, further comprising reporting a result of said comparing step.

3. The method of claim 1, wherein the plurality of checks in the validation rule set include checks to insure that the part produced according to the design meets industry standards.

4. The method of claim 1, wherein said validation rule set is queried by a key value.

5. The method of claim 4, wherein said key value is supplied by one of a user input and a part attribute.

6. The method of claim 1, wherein the plurality of events include milestone events to check whether the design of the part in the computer aided design application is in accordance with in the validation rule set at each of the milestone events.

7. The method of claim 1, further comprising associating a status check with said comparing step.

8. A computer-program product tangibly embodied in a non-transitory machine readable medium to perform a method for validating a rule set for applicable checks of a part, comprising instructions operable to cause a computer to:
    generate a design of the part using a computer aided design application;
    query a validation rule set, the validation rule set being produced by translating an inputted set of design requirements, the validation rule set corresponding to a plurality of datatypes including at least one of part files, sheet-metal files, and master files;
    correlate a part data to said validation rule set; and
    compare the design of the part against said part data to determine whether the design of the part passes a plurality of checks in the validation rule set, the plurality of checks including one or more requirements for the design of the part at a plurality of events throughout the design of the part;
    whereby said part is approved at an event in the plurality of events, wherein the plurality of checks include mandatory checks and optional checks for the one or more requirements for the design of the part, wherein the design of the part is compared against each of the mandatory checks and optional checks for the one or more requirements for the design of the part, and wherein results from the optional checks are not included in approving the design of the part at the event.

9. The product of claim 8, further comprising instructions to report a result of said comparing step.

10. The product of claim 8, wherein the plurality of checks in the validation rule set include checks to insure that the part produced according to the design meets industry standards.

11. The product of claim 8, wherein said validation rule set is queried by a key value.

12. The product of claim 11, wherein said key value is supplied by one of a user input and a part attribute.

13. The product of claim 8, wherein the plurality of events include milestone events for the computer to determine whether the design of the part in the computer aided design application is in accordance with in the validation rule set at each of the milestone events.

14. The product of claim 8, further comprising instructions to associate a status check with the comparison of the design of the part against the part data to determine whether the design of the part passes a plurality of checks in the validation rule.

15. A data processing system comprising:
a processor; and
an accessible memory, the data processing system configured to:
    generate a design of a part using a computer aided design application;
    query a validation rule set, the validation rule set being produced by translating an inputted set of design requirements, the validation rule set corresponding to a plurality of datatypes including at least one of part files, sheet-metal files, and master files;
    correlate a part data to said validation rule set; and
    compare the design of the part against said part data to determine whether the design of the part passes a plurality of checks in the validation rule set, the plurality of checks including one or more requirements for the design of the part at a plurality of events throughout the design of the part, wherein the plurality of checks include mandatory checks and optional checks for the one or more requirements for the design of the part, wherein the design of the part is compared against each of the mandatory checks and optional checks for the one or more requirements for the design of the part, and wherein results from the optional checks are not included in approving the design of the part at the event.

16. The data processing system of claim 15, wherein the plurality of checks in the validation rule set include checks to insure that the part produced according to the design meets industry standards.

17. The data processing system of claim 15, wherein the plurality of events include milestone events for the data processing system to determine whether the design of the part in the computer aided design application is in accordance with in the validation rule set at each of the milestone events.

* * * * *